(12) United States Patent
Bingle et al.

(10) Patent No.: US 7,911,321 B2
(45) Date of Patent: Mar. 22, 2011

(54) KEYLESS ENTRY SYSTEM INCORPORATING CONCEALABLE KEYPAD

(75) Inventors: Robert L. Bingle, Zeeland, MI (US); Joseph Meinke, Gowen, MI (US)

(73) Assignee: ADAC Plastics, Inc., Grand Rapids, MI (US)

( * ) Notice: Subject to any disclaimer, the term of this patent is extended or adjusted under 35 U.S.C. 154(b) by 84 days.

(21) Appl. No.: 12/486,827

(22) Filed: Jun. 18, 2009

(65) Prior Publication Data

US 2010/0219935 A1 Sep. 2, 2010

Related U.S. Application Data (63) Continuation-in-part of application No. 11/163,665, filed on Oct. 26, 2005, now Pat. No. 7,576,631.

(60) Provisional application No. 60/522,663, filed on Oct. 26, 2004.

(51) Int. Cl.
*G06K 19/00* (2006.01)
(52) U.S. Cl. ................... 340/5.54; 340/5.72; 362/501
(58) Field of Classification Search ............. 340/5.54, 340/5.72; 362/501
See application file for complete search history.

(56) References Cited

U.S. PATENT DOCUMENTS

| | | | |
|---|---|---|---|
| 4,494,326 A | 1/1985 | Kanamori | |
| 4,898,010 A | 2/1990 | Futami et al. | |
| 4,965,950 A | 10/1990 | Yamada | |
| 6,031,465 A | 2/2000 | Burgess | |
| 6,084,317 A | 7/2000 | Wolfe et al. | |
| 6,190,026 B1 | 2/2001 | Moore | |
| 6,323,761 B1 | 11/2001 | Son | |
| 6,604,834 B2 | 8/2003 | Kalana | |
| 6,617,975 B1 | 9/2003 | Burgess | |
| 6,669,267 B1 | 12/2003 | Lynam et al. | |
| 6,854,870 B2 | 2/2005 | Huizenga | |
| 7,126,453 B2 | 10/2006 | Sandau et al. | |
| 7,400,232 B2 | 7/2008 | Reichling et al. | |
| 7,511,602 B2 | 3/2009 | Huntzicker | |
| 2003/0031025 A1 | 2/2003 | Huizenga | |
| 2003/0216817 A1 | 11/2003 | Pudney | |
| 2004/0053648 A1 | 3/2004 | Gremo et al. | |
| 2004/0208012 A1 | 10/2004 | Wang | |
| 2006/0262549 A1 | 11/2006 | Schmidt et al. | |

*Primary Examiner* — Jeffery Hofsass
(74) *Attorney, Agent, or Firm* — McGarry Bair PC (57) ABSTRACT

A keyless entry system has a handle housing and a grip cover defining a door handle grip, a keyless entry pad defining a plurality of keys, each identified with a corresponding symbol, a plurality of sensors in proximity to the keys for detecting an object in the vicinity of the keys, an illumination source to selectively backlight the sensors and symbols, and a light-controlling membrane extending over the keyless entry pad. Entering a keyless entry code into the keyless entry pad by selecting keys in a predetermined sequence enables a latch to be selectively disposed in either a locked condition or an unlocked condition. In ambient light, the light-controlling membrane renders the symbol invisible. When the illumination source backlights the sensor and the symbol, the light-controlling membrane renders the symbol visible.

20 Claims, 11 Drawing Sheets

KEYLESS ENTRY SYSTEM INCORPORATING CONCEALABLE KEYPAD

CROSS-REFERENCE TO RELATED APPLICATION

This application is a continuation-in-part of U.S. patent application Ser. No. 11/163,665, filed Oct. 26, 2005, now U.S. Pat. No. 7,576,631, issued Aug. 18, 2009, which claims the benefit of U.S. Patent Application No. 60/522,663, filed Oct. 26, 2004, each of which is fully incorporated herein by reference.

BACKGROUND OF THE INVENTION

1. Field of the Invention

The invention relates generally to a keyless entry system for a vehicle. In one aspect, the invention relates to a keyless entry system with a keyless entry pad incorporating a textual representation of the vehicle and/or a user of the vehicle. In another aspect, the invention relates to a keyless entry system with a keyless entry pad overlain by a light-controlling membrane.

2. Description of the Related Art

Keyless entry systems have long been employed in passenger vehicles to permit vehicle doors to be unlocked without requiring the user to insert a key into a keyhole typically provided adjacent to an entry handle on the vehicle door or incorporated into the entry handle. Rather, the keyless entry system comprises a keypad, typically having four or five keys, mounted either on the vehicle door, such as adjacent to the handle, or provided on the entry handle itself. Pressing the keys on the keypad in the correct sequence causes an unlock signal to be issued to a latch on the vehicular entry door. Subsequent actuation of the vehicle handle opens the entry door.

Figure 1:
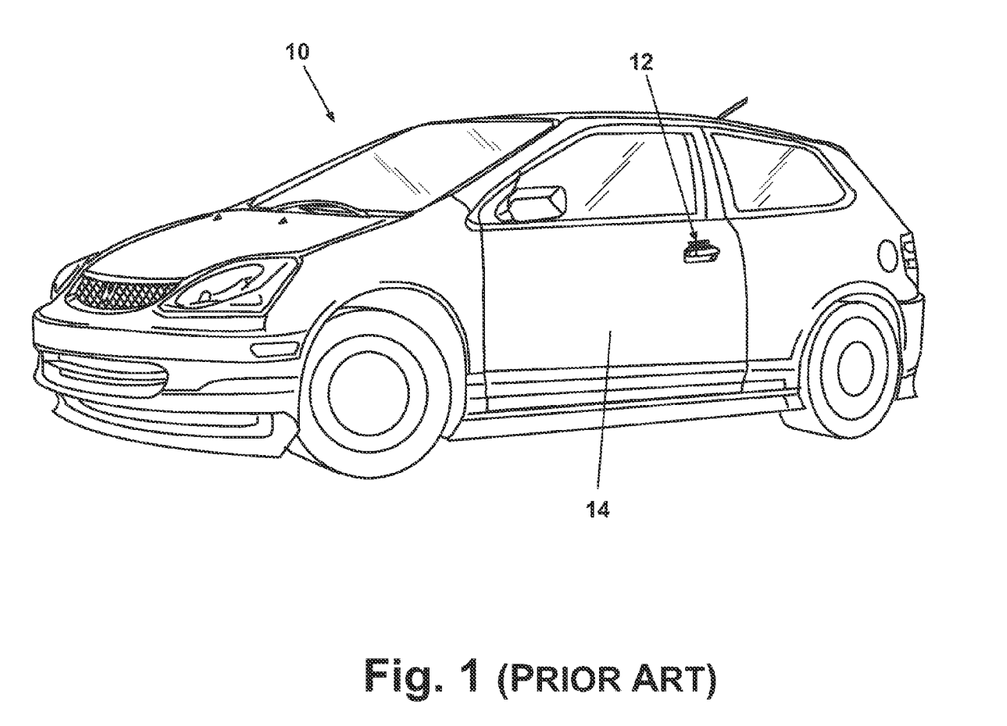
FIG. 1 is a perspective view of a vehicle with a driver's side vehicular entry door having a prior art handle and a prior art keyless entry system.
Figure 2:
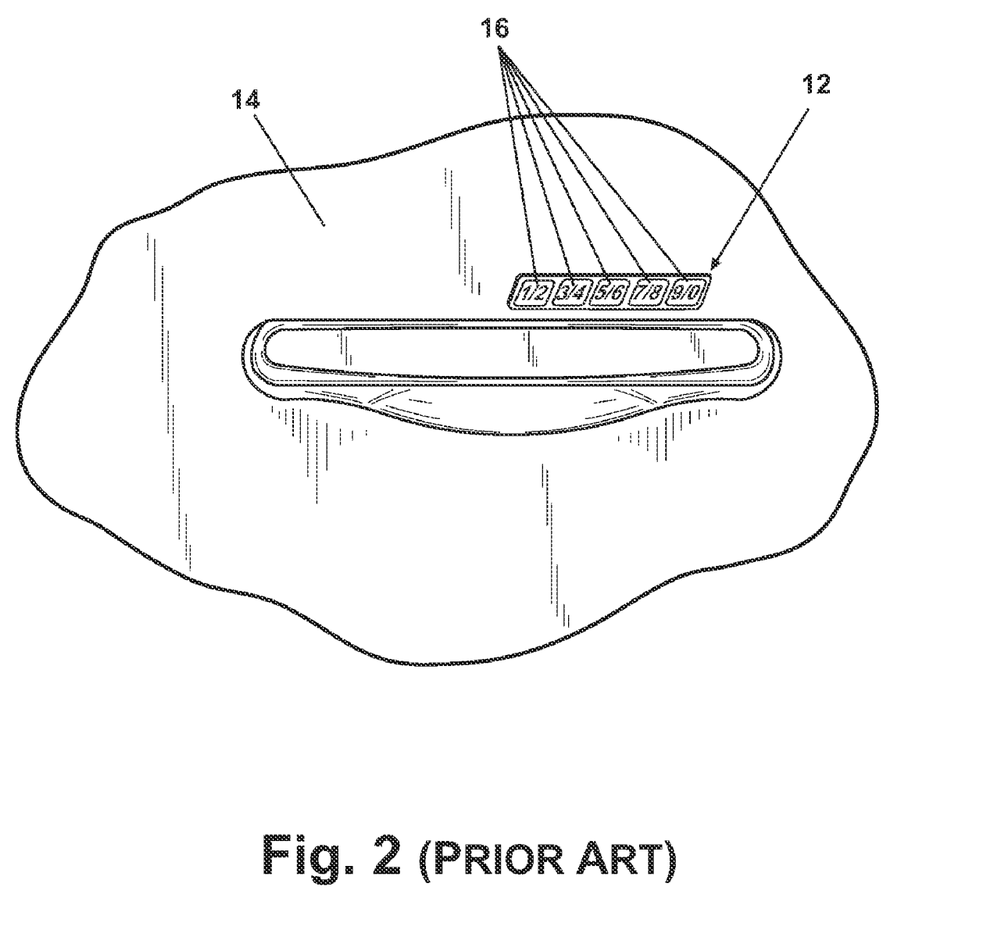
FIG. 2 is an enlarged perspective view of the prior art handle of FIG. 1 and a five-key numeric entry pad (1-2 3-4 5-6 7-8 9-0) of the prior art keyless entry system mounted to the door above the handle.

An example of a vehicle 10 with a prior art keyless entry system 12 is shown in FIGS. 1 and 2. The keyless entry system 12 is located on a vehicle entry door 14 and comprises a series of keys 16, and five of the keys 16 are illustrated for exemplary purposes in FIGS. 1 and 2. The keys 16 have corresponding numbers so that the user can enter a numerical code to initiate the unlock signal. In FIGS. 1 and 2, each of the keys 16 has a pair of numbers, such as, e.g., 1-2, 3-4, 5-6, 7-8, and 9-0.

Some issues have arisen with such prior art numeric keyless entry systems. First, users are required to remember a particular sequence of numbers, which can be difficult for some users. Second, the keyless entry system is mounted on the door and is, therefore, readily apparent from a visual inspection of the vehicle. As a result, the keyless entry system detracts from the aesthetic appearance of the vehicle, and the existence of a keyless means of entry to the vehicle is obvious by a simple visual inspection thereof by third parties.

BRIEF DESCRIPTION OF THE INVENTION

A keyless entry system has a handle housing and a grip cover defining a door handle grip, a keyless entry pad defining a plurality of keys, each identified with a corresponding symbol, a plurality of sensors in proximity to the keys for detecting an object in the vicinity of the keys, an illumination source to selectively backlight the sensors and symbols, and a light-controlling membrane extending over the keyless entry pad. Entering a keyless entry code into the keyless entry pad by selecting keys in a predetermined sequence enables a latch to be selectively disposed in either a locked condition or an unlocked condition. In ambient light, the light-controlling membrane renders the symbol invisible. When the illumination source backlights the sensor and the symbol, the light-controlling membrane renders the symbol visible.

DETAILED DESCRIPTION OF EMBODIMENTS OF THE INVENTION

Figure 3:
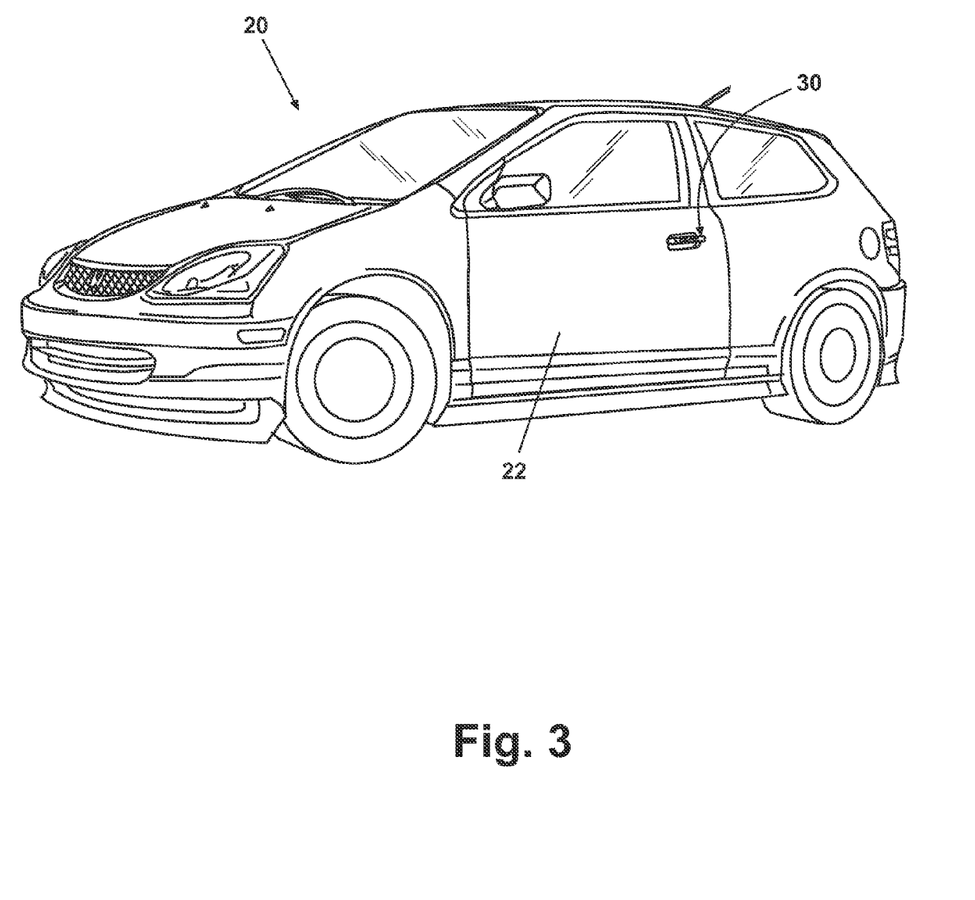
FIG. 3 is a perspective view of a vehicle with a vehicular entry door provided with a keyless entry system comprising a vehicular handle with a non-numeric keyless entry pad according to the invention, wherein the vehicular entry door is shown in a closed position.
Figure 4:
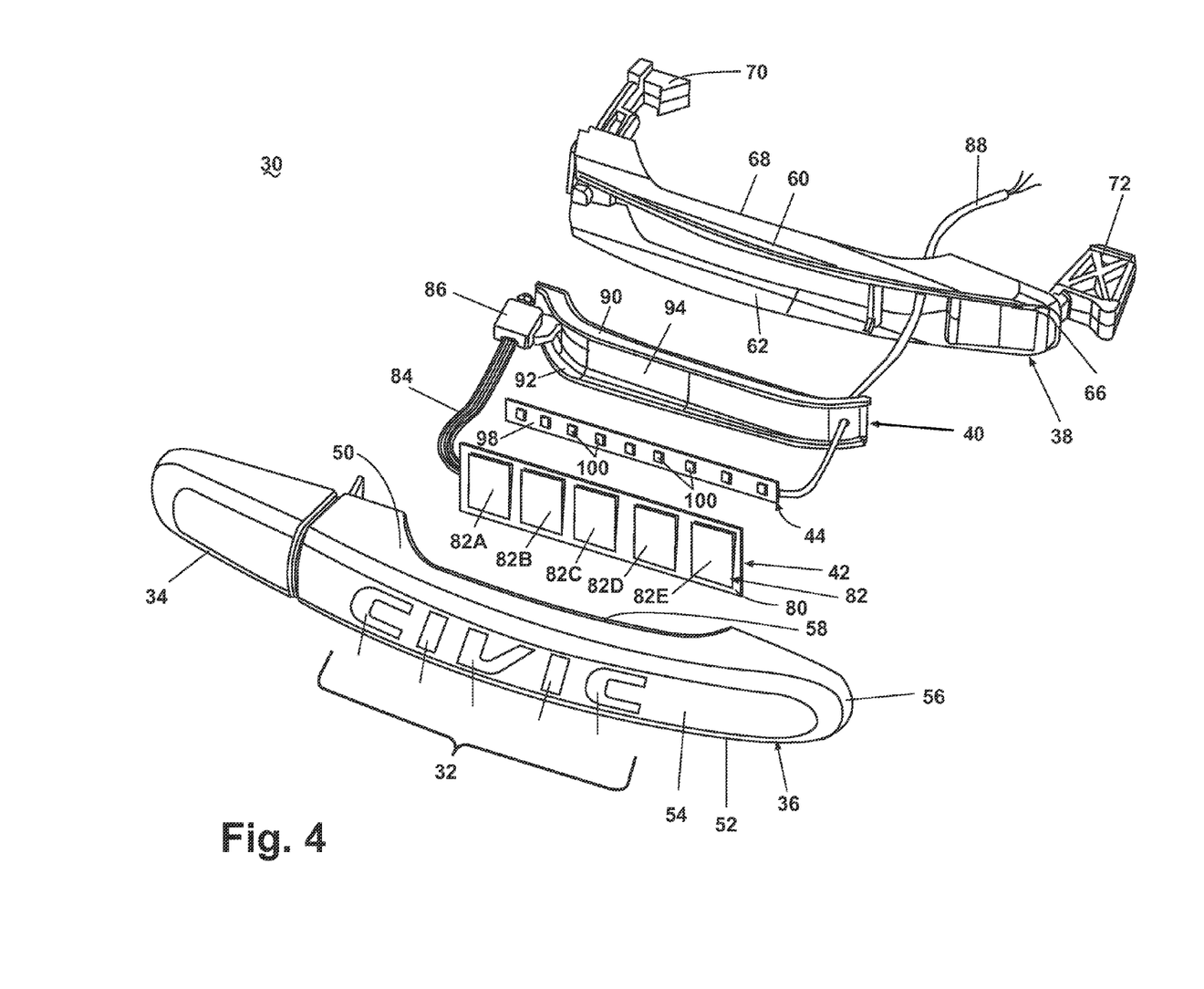
FIG. 4 is an exploded, perspective view of the vehicular handle with the non-numeric keyless entry pad of FIG. 3.
Figure 5:
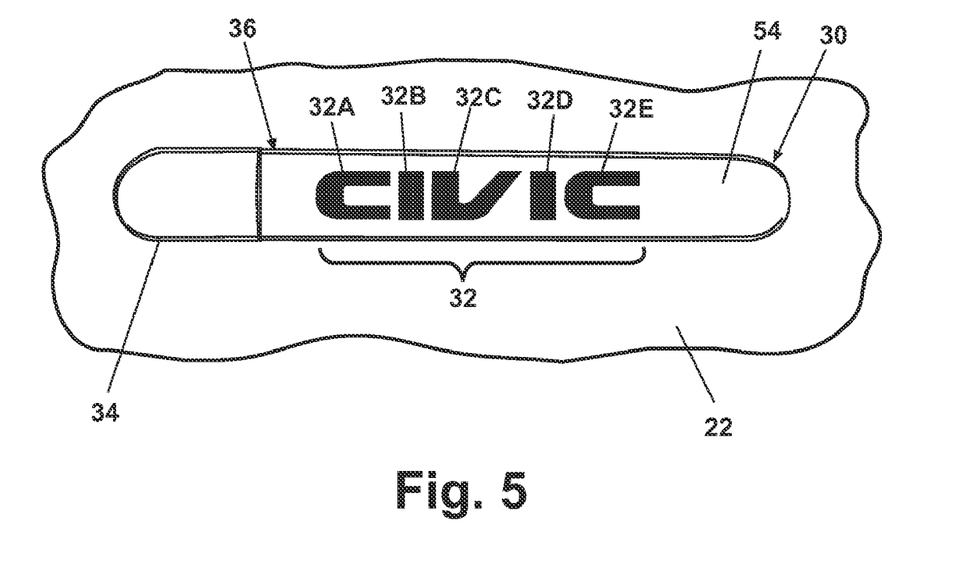
FIG. 5 is a side elevational view of the vehicular handle with the non-numeric keyless entry pad of FIG. 3, wherein the non-numeric keyless entry pad is not illuminated.

Referring now to the figures and particularly to FIGS. 3-5, a vehicle 20 comprises an entry door 22 having an entry handle 30 with a non-numeric keyless entry system according to the invention. The non-numeric keyless entry system is preferably integrated with the entry handle 30 and has a non-numeric keyless entry pad formed by a plurality of keys 32 provided with non-numeric characters or symbols that are textually representative of the vehicle 20 and/or a user of the vehicle 20. Examples of textual representations of the vehicle are a make and/or model of the vehicle 20. Examples of textual representations of the user of the vehicle include the user's name, the user's favorite sports teams and other favorite things of the user, the user's zodiac sign, and the like. As a result, the non-numeric keyless entry system blends in with the appearance of the entry handle 30, can provide vehicle badging, can personalize the vehicle 20, and has non-numeric entry codes that are easily remembered by the user.

It will be understood that the phrase "numeric" in this application means a keypad formed solely from numbers, e.g., 1-2, 3-4, 5-6, 7-8, 9-0, as opposed to "non-numeric", which means a keypad formed solely from alphabetic characters, e.g., C-I-V-I-C, from alphanumeric characters, e.g., B-M-W-3-2-5, graphic symbols, or from other symbols that comprise more than only numbers.

It will also be understood that the keyless entry pad can have any number of keys 32, and the entry code associated therewith can have any number of characters making up the entry code.

With continued reference to FIGS. 3-5, the entry handle 30 comprises a grip cover 36 that mates with a handle housing 38 pivotally mounted to the entry door 22 and operatively coupled with a door latch (not shown) located inside the entry door 22. Together, the grip cover 36 and the handle housing 38 form a grip that can be grasped by the user. The entry handle 30 further includes an illumination source holder 40 mounted to the handle housing 38 and a sensor keypad 42 sandwiched between the illumination source holder 40 and the grip cover 36. The illumination source holder 40 supports an optional illumination source assembly 44 to provide backlighting to the non-numeric keyless entry pad.

The grip cover 36 comprises opposing upper and lower walls 50, 52 joined by an elongated and arcuate front wall 54 and a curved side wall 56. Each of the upper and lower walls 50, 52 includes an arcuate cutout 58 shaped and sized so that the user can grasp the grip cover 36 in a hand with a palm facing the front wall 54 and a plurality of fingers wrapped around the arcuate cutouts 58 in a conventional fashion. The grip cover 36 functions as the non-numeric keyless entry pad and includes the aforementioned keys 32 on the front wall 54. The entry handle 30 further comprises a bezel 34 mounted to the entry door 22 adjacent to and coextensive with the grip cover 36.

Each of the keys 32 has at least one non-numeric character or symbol, and the non-numeric characters or symbols of the keys 32 together are textually representative of the vehicle 20 and/or the user of the vehicle 20. Examples of textual representations of the vehicle include the make and/or model of the vehicle 20, and a logo associated with the vehicle 20. Examples of textual representations of the user of the vehicle include the user's name, the user's favorite sports teams and other favorite things of the user, the user's zodiac sign, or other words/phrases/names to personalize the vehicle 20. For example, in the illustrated embodiment, the keypad comprises five keys 32A-32E having the characters C-I-V-I-C, which textually represents the model of the vehicle, a Honda Civic®.

The keys 32 can be integrated with the grip cover 36 or applied to the grip cover 36 in any suitable manner. Additionally, the keys 32 can be made of a material that is the same as or different from the material of the grip cover 36 and that has a color that is same as or different than the color of the grip cover 36. The keys 32 can be molded with the grip cover 36 with processes such as insert molding or two-shot molding. Additionally, the keys 32 are preferably at least partially translucent so that they can be backlit by the illumination source. Optionally, the keys 32, or the grip cover 36, can be coated with a specialty paint or finish that renders the characters or symbols invisible until the illumination source activates to backlight the keys 32 and thereby render the characters or symbols visible through the paint or finish, as herein after described. Alternatively, the keys 32 can be opaque when the entry handle 30 does not include an illumination source. Further, the keys 32 can be flush with the grip cover 36, raised, or embossed, depending on the desired appearance of the entry handle 30.

Similar to the grip cover 36, the handle housing 38 comprises opposing upper and lower walls 60, 62 joined by a curved side wall 66. Further, each of the upper and lower walls 60, 62 includes an arcuate cutout 68 that corresponds to the arcuate cutouts 58 of the grip cover 36. A latch actuator 70 oriented generally perpendicular to the upper and lower walls 60, 62 extends from one end of the handle housing 38 and into the entry door 22 and is operatively coupled to the door latch. A pivot mount 72 at the other end of the handle housing 38 projects into the entry door 22 for pivotally coupling the entry handle 30 to the entry door 22. Movement of the handle housing 38 about the pivot mount 72 moves the latch actuator 70 to unlatch the door latch and thereby enable the user to open the entry door 22. However, the door latch must be unlocked prior to actuation thereof by the latch actuator 70.

The sensor keypad 42 comprises base 80, which can be flexible, that supports a plurality of sensors 82 of a quantity corresponding to the quantity of keys 32 on the grip cover 36. In the illustrated embodiment, the sensor keypad 42 comprises five sensors 82A-82E corresponding to the five keys 32A-32E. The sensors 82 can be any suitable type of sensor, such as field effect sensors or capacitance sensors that can be activated when a finger is in the vicinity of the sensor, such as when the user touches the corresponding key 32 on the grip cover 36, or mechanical sensors that activate when pressure is applied to the sensor. According to one embodiment, at least the sensors 82 of the sensor keypad 42 are translucent or at least light-transmissive so that light can be transmitted therethrough for backlighting the keyless entry pad. When mounted in the entry handle 30, the sensors 82 register with the keys 32 on the grip cover 36 so that one of the sensors 82A-82E activates when the user selects the corresponding key 32A-32E, such as by touching the corresponding key 32A-32E. A flexible circuit 84 attached to the flexible base 80 terminates in an electrical connector 86 that is fed through the handle housing 38. The electrical connector 86 is coupled to a controller or processor (not shown), which communicates with the door latch and sends an unlock signal to door latch when the sensors 82 on the sensor keypad 42 are activated in a sequence corresponding to a non-numeric entry code, as will be described in more detail hereinafter.

Figure 6:
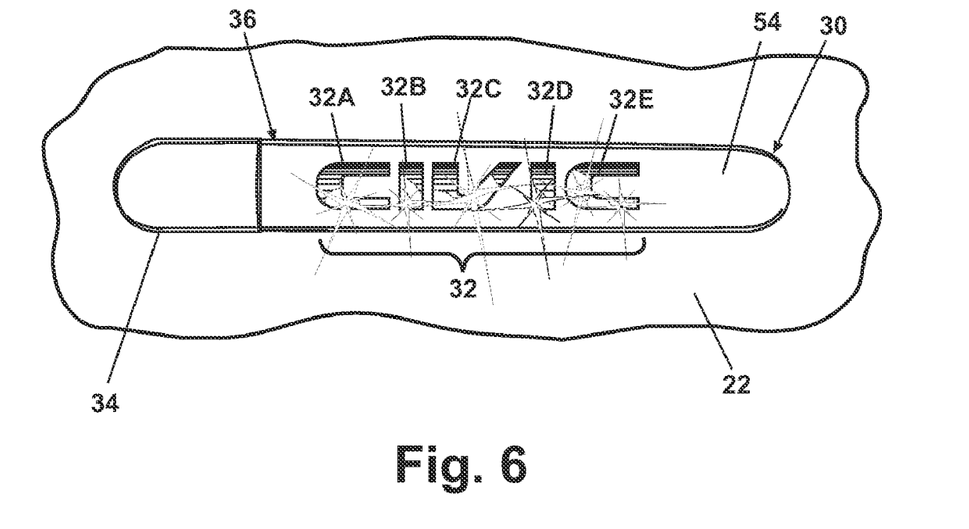
FIG. 6 is a side elevational view of the vehicular handle with the non-numeric keyless entry pad of FIG. 5, wherein the non-numeric keyless entry pad is in an illuminated backlit state.

The illumination source holder 40 comprises opposing upper and lower walls 90, 92 joined by an arcuate rear wall 94 that supports an illumination source assembly 44, which is shown in the illustrated embodiment as having a base 98, a plurality of light sources 100, and an electrical connector 88. The illumination source holder 40 is mounted to the handle housing 38 to thereby mount the illumination source assembly 44 to the handle housing 38. The illumination source holder 40 supports the illumination source assembly 44 in a position whereby the light sources 100 are in register with the five sensors 82A-82E, which, as mentioned above, are at least partially translucent or at least light-transmissive so that the light sources 100, when activated, illuminate the keys 32 to provide a backlight to the keyless entry pad, as illustrated in FIG. 6. The base 98 and/or the rear wall 94 of the illumination source holder 40 includes a reflector to reflect the light from the light sources 100 toward the sensors 82 and the keys 32 for backlighting the keyless entry pad. The light sources 100 can be any suitable source of light and are preferably light emitting diodes (LEDs) that can be illuminated individually, in groups, or all at once. The electrical connector 88 is fed through the handle housing 38 and coupled to the controller, which sends signals to the illumination source assembly 44 to illuminate an individual light source 100 or a group of light sources 100 depending on which keys 32 the user selects.

An exemplary description of the assembly of the entry handle 30 with the non-numeric keyless entry system according to the invention follows. It will be apparent to one of ordinary skill that the assembly can proceed in any logical sequence and is not limited to the order presented below. The following description is for illustrative purposes only and is not intended to limit the invention in any way.

To assemble the entry handle 30, the illumination source assembly 44 is attached to the illumination source holder 40, and the illumination source holder 40 is mounted to the handle housing 38. Next, the sensor keypad 42 is positioned between the illumination source holder 40 and the grip cover 36 such that the light sources 100, the sensors 82, and the keys 32 are aligned with one another, and the grip cover 36 is coupled to the handle housing 38. The keys 32 that function as the non-numeric keyless entry pad are operatively coupled to the sensors 82 on the sensor keypad 80 so that the correct sensors 82 are activated when the user touches the keys 32. When the sensors 82 are field-effect or capacitance sensors, simply aligning the keys 32 with sensors 82 operatively couples the keys to the sensors 82. When the sensors 82 are mechanical sensors, the force applied to the keys 32 can be directly transferred to the sensors 82 or can be transferred indirectly through a mechanism that operatively couples the keys 32 to the sensors 82. When assembled, the grip cover 36 and the handle housing 38 join in a water-tight manner such that the sensor keypad 42 and the illumination source assembly 44 are protected from the environment exterior of the vehicle 20. Once the entry handle 30 is assembled, it is mounted to the entry door 22 with the latch actuator 70 operatively coupled to the door latch, the pivot holder 72 disposed inside the entry door 22, and the electrical connectors 86, 88 electrically coupled to the controller. Finally, the bezel 34 is mounted to the entry door 22 in alignment with the grip cover 36.

An exemplary description of the operation of the entry handle 30 with the non-numeric keyless entry system according to the invention follows. It will be apparent to one of ordinary skill that the operation can proceed in any logical sequence and is not limited to the order presented below. The following description is for illustrative purposes only and is not intended to limit the invention in any way.

Prior to use of the entry handle 30 with the non-numeric keyless entry system, the door latch is in a latched condition, wherein the door cannot be opened by the user, and a locked condition, wherein movement of the entry handle 30 relative to the entry door 22 cannot change the condition of the door latch from the latched condition to an unlatched condition, wherein the door can be opened by the user. To unlock the entry door 22, the user selects, such as by touching, the keys 32 on the grip cover 36 in a sequence corresponding to the non-numeric entry code. As the user touches each key 32, the corresponding sensor 82 on the sensor keypad 42 activates and sends a signal to the controller. In response, the controller sends a signal to the illumination source assembly 44, and the light sources 100 corresponding to the key 32 touched by the user activate to backlight the touched key 32.

Figure 7:
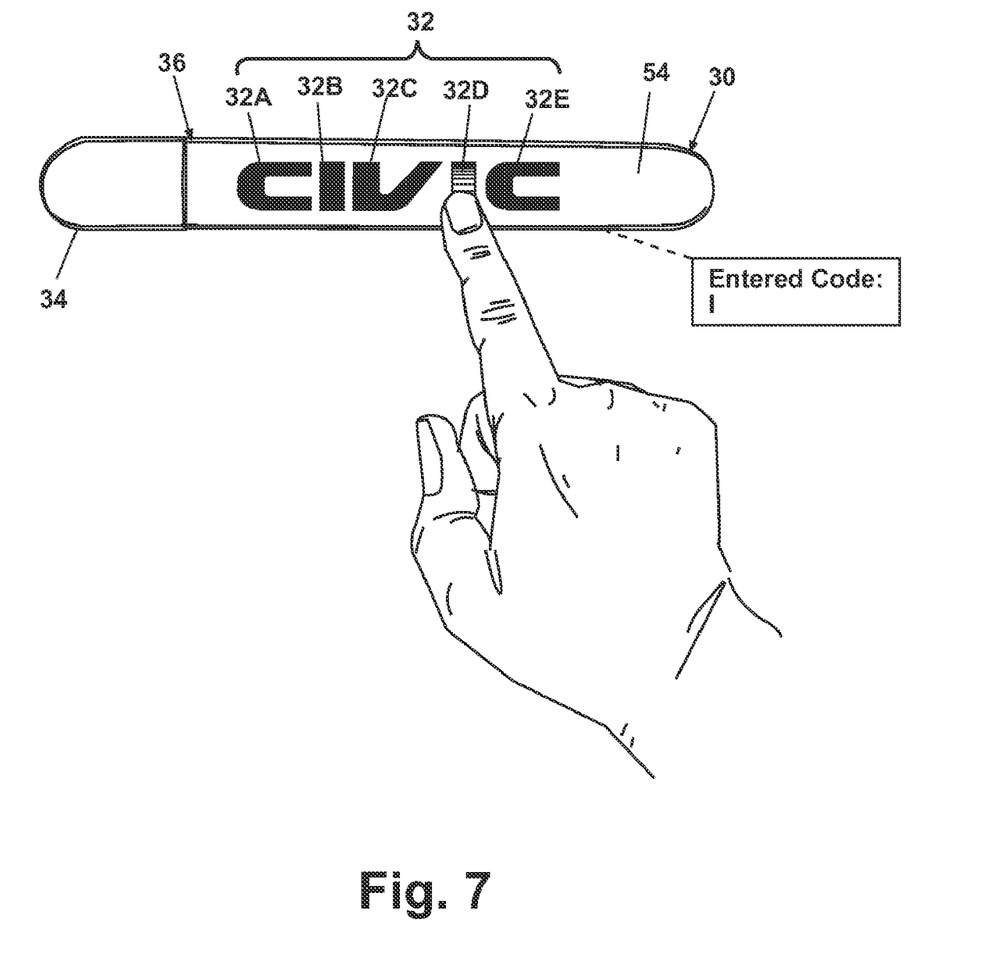
FIG. 7 shows a user pressing a first key of a non-numeric entry code on the non-numeric keyless entry pad of FIG. 5, with an inset showing a corresponding first character of the non-numeric entry code according to the invention.
Figure 8:
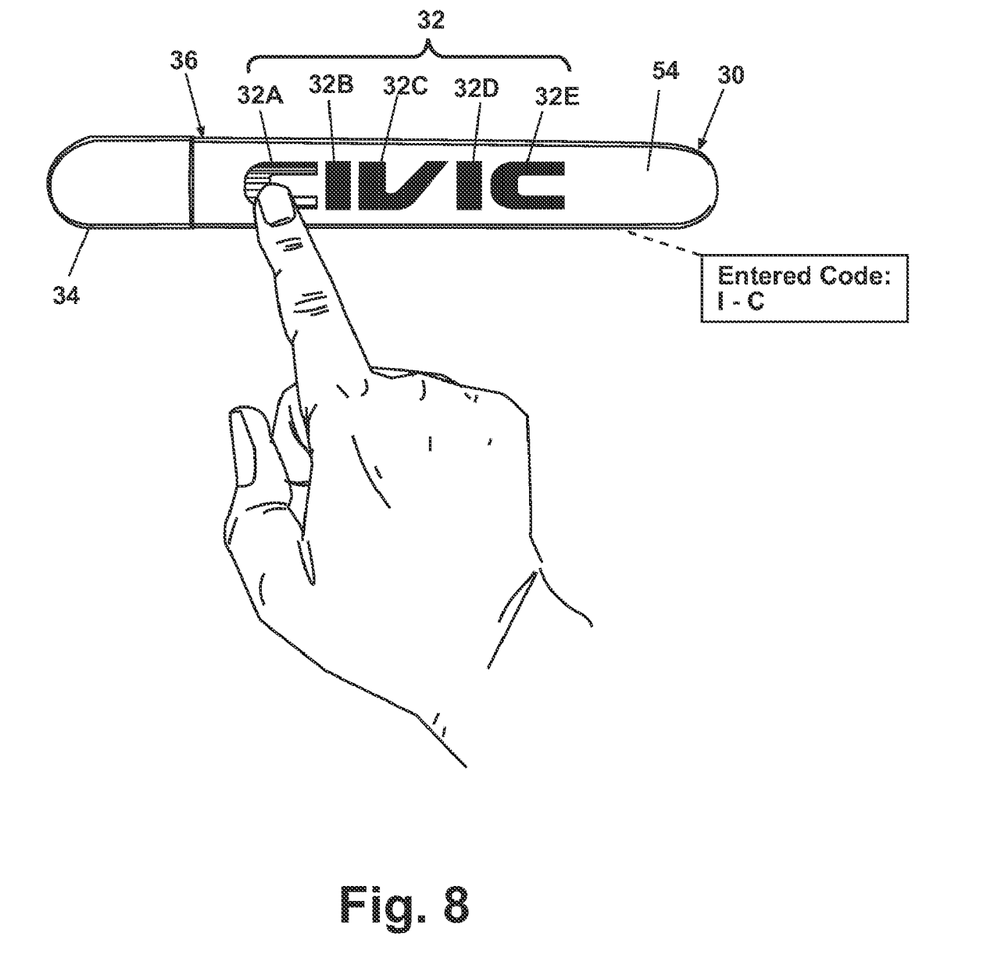
FIG. 8 shows a user pressing a second key of the non-numeric entry code on the non-numeric keyless entry pad of FIG. 5, with an inset showing a corresponding second character of a non-numeric entry code according to the invention.
Figure 9:
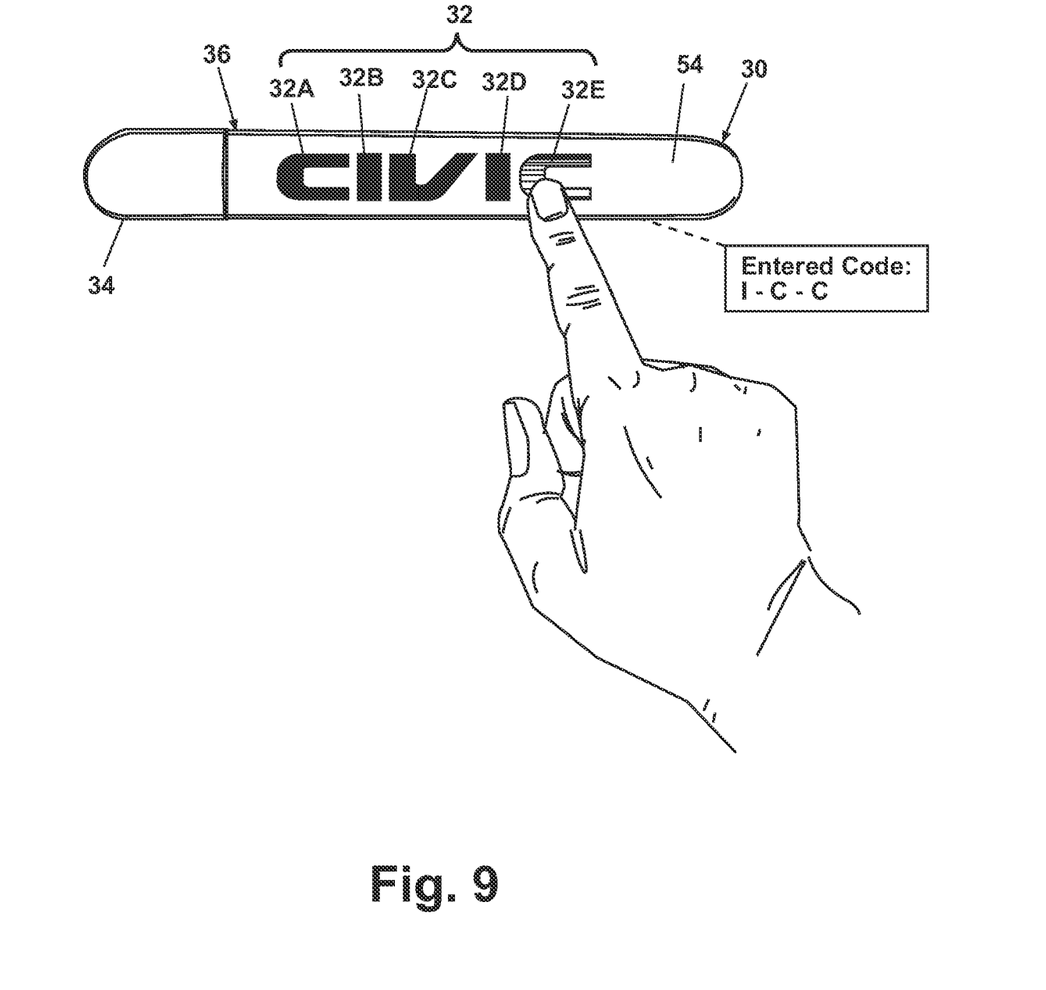
FIG. 9 shows a user pressing a third key of the non-numeric entry code on the non-numeric keyless entry pad of FIG. 5, with an inset showing a corresponding third character of a non-numeric entry code according to the invention.
Figure 10:
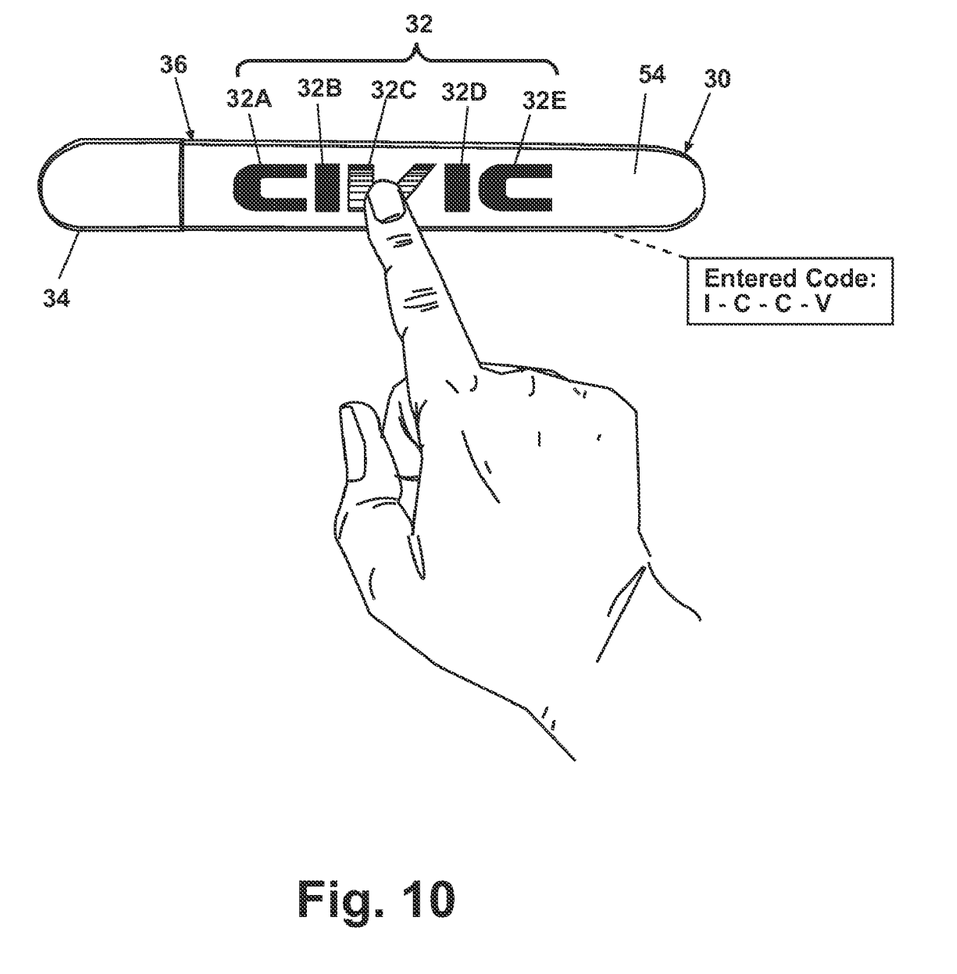
FIG. 10 shows a user pressing a fourth key of the non-numeric entry code on the non-numeric keyless entry pad of FIG. 5, with an inset showing a corresponding fourth character of a non-numeric entry code according to the invention.
Figure 11:
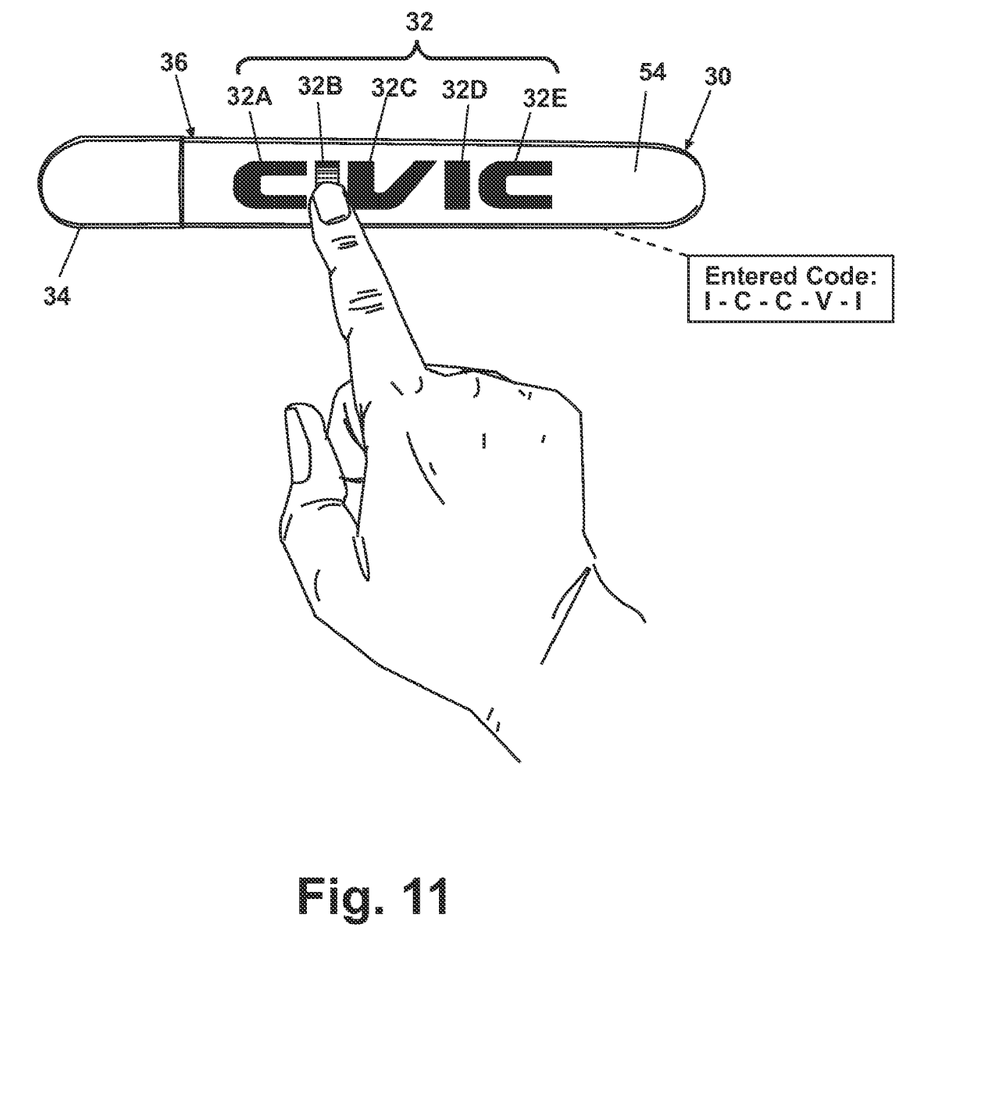
FIG. 11 shows a user pressing a fifth key of the non-numeric entry code on the non-numeric keyless entry pad of FIG. 5, with an inset showing a corresponding fifth character of a non-numeric entry code according to the invention.

An example of the process of entering the non-numeric entry code is shown in FIGS. 7-11. In this example, the non-numeric entry code is "ICCVI," but the non-numeric entry code can be any combination and sequence of characters associated with the keys 32. As shown in FIG. 7, the user touches the key 32D corresponding to the character "I," and in response, the sensor 82D sends a signal to the controller, which sends a signal to the illumination source assembly 44 to activate the light sources 100 that correspond to the sensor 82D and the key 32D. As a result, the key 32D is backlit, as shown in FIG. 7. The process repeats for the remainder of the non-numeric entry code, as depicted in FIGS. 8-11.

Figure 12:
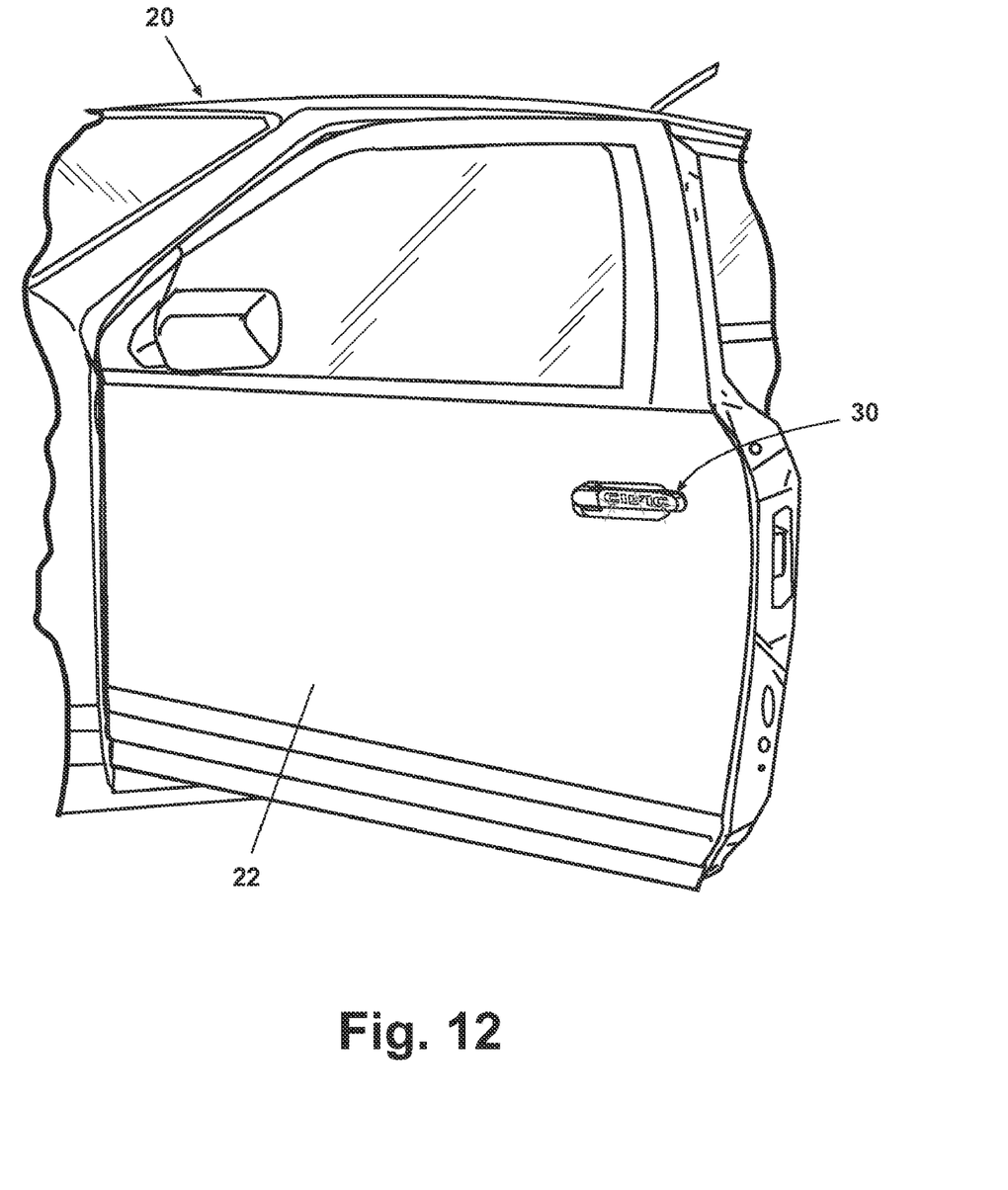
FIG. 12 is a perspective view of the vehicle of FIG. 3, with the vehicular entry door being shown opened upon the user's successful entry of the non-numeric entry code in FIGS. 7-11.

As the user selects each key 32, the controller records the sequence in which the keys 32A-E are selected, and when the non-numeric entry code is touched in the correct sequence, the controller sends an unlock signal to the door latch and a signal to the illumination source assembly 44 to illuminate all of the light sources 100, which communicates to the user that the non-numeric entry code has been correctly entered and that the user can actuate the entry handle 30 to unlatch the door latch and open the entry door 22. The user then grasps and pulls the grip cover 36 and the handle housing 38 to pivot the entry handle 30 about the pivot mount 72 and thereby move the latch actuator 70 to unlatch the door latch. As the user continues to pull on the entry handle 30, the entry door 22 opens, as illustrated in FIG. 12, and the user can access the interior of the vehicle 20.

As stated previously, the illumination source assembly 44 for backlighting the keys 32 is optional. The non-numeric keyless entry system according to the invention without the illumination source assembly 44 functions in the same manner as described above, except that the keys 32 are not backlit when individual keys 32 are selected by a user or when the entire non-numeric entry code is entered in the correct sequence. In lieu of (or in addition to) the illumination source, the non-numeric keyless entry system can comprise an alternative signal system, such as an audio signal system that produces audible signals for communication with the user, such as to indicate that the entire non-numeric entry code is entered in the correct sequence.

When the non-numeric keyless entry system includes the illumination system, the light sources 100 can be activated in response to actions other than the user selecting the keys 32. For example, the light sources 100 can be activated when the user actuates a turn signal on the vehicle 20, when the user activates a remote door entry module, commonly known as a fob, associated with the vehicle 20, such as by pressing buttons on the fob, when the user with a fob associated with the vehicle 20 approaches the vehicle 20, or when the user opens the entry door 22 from the interior of the vehicle 20. In these situations, the backlit keys 32 can function as a turn signal, a security lamp, or a puddle light.

In another alternative embodiment, the entry handle 30 can comprise an additional sensor that detects when a user touches any part of the entry handle 30 to initiate or turn on the non-numeric keyless entry system. Further, all of the light sources 100 can activate when the non-numeric keyless entry system initiates in response to the user touching the entry handle 30 so that the user can easily see the characters or symbols on the keys 32. Alternatively, all the light sources 100 can remain activated while the user enters the non-numeric entry code rather than only illuminating the keys 32 that are selected by the user.

The keyless entry system according to the invention has been described above as non-numeric to differentiate the system from prior art keyless entry systems that rely on a random numeric entry code, as described in the background of the invention. It is within the scope of the invention, however, for the characters and symbols associated with the keys 32 to be numerical if the textual description of the vehicle make and/or model, the logo associated with the vehicle 20, or the other words/phrases/names that personalize the vehicle 20 includes numbers. For example, many vehicle models names are numbers or combinations of numbers and letters.

Additionally, the keyless entry system has been shown and described as being integrated with the entry handle 30. In particular, the illustrated embodiment is a strap-type handle, and the keyless entry pad is formed on the grip. However, it is within the scope of the invention for the keyless entry system to be integrated into another type of handle, such as a paddle-type handle, or directly mounted to the entry door 22, including the portion of the entry door 22 commonly known as the B-pillar. When the keyless entry system is integrated into an entry handle, the keyless entry pad can be formed on the grip or on an escutcheon plate portion of the handle, if the handle includes the escutcheon plate portion. Furthermore, the keyless entry system can be incorporated into other components of the vehicle 20, such as on a trunk and on the body of the vehicle 20 near the entry door 22. The keyless entry system can also be utilized in conjunction with opening the trunk in a manner similar to that described above for opening the entry door 22.

The keyless entry system according to the invention offers several advantages. When the characters or symbols are a textual representation of a characteristic of the vehicle 20, the keyless entry system is effectively concealed and contributes positively to the aesthetic appearance of the vehicle. Additionally, most vehicles include a badge thereon to identify the make and/or model of the vehicle, and integrating this information into the handle eliminates the need for a separate badge, thereby reducing the quantity of components for the vehicle 20. Combining the keyless entry system with the vehicle make and/or model promotes and advertises the brand of the automobile manufacturer. When the characters or symbols are a textual representation of the user of the vehicle 20, the keyless entry system provides a way to personalize the vehicle 20 in a functional manner. Furthermore, the non-numeric entry code is easier to remember than the random numerical entry code of prior art keyless entry systems, and, depending on the characters and/or symbols in the textual representation of the vehicle 20 and/or the user of the vehicle 20, the non-numeric entry code can be selected to form a word or an acronym that is especially easy to recall.

As mentioned previously herein, the keys 32 or the grip cover 36 can be coated with a specialty paint or finish that renders the characters or symbols invisible until the illumination source activates to backlight the keys 32 and thereby render the characters or symbols visible through the paint or finish. The finish can conceal the characters/symbols and the illumination source when the illumination source is not illuminated and can provide the keys 32, the grip cover 36, or the complete entry handle 30 with a desired external appearance. Additionally, the finish can be substantially opaque when viewed from the outward or obverse side of the door 22 to conceal the illumination source, the characters/symbols, or any other components on the inward or reverse side of the finish when the illumination source is not illuminated. However, the finish can transmit light generated from the illumination source on the inward side thereof so that an observer can view light from the illumination source and thereby view the characters/symbols when the illumination source is in an illuminated state.

The finish hides the illumination source and the characters/symbols when the illumination source is in a non-illuminated state, and thereby gives the keys 32, the grip cover 36, or the complete entry handle 30 an appearance identical to a vehicular trim component, such as a door panel, without an observable indicium. The finish can be selected so that the appearance of the entry handle 30 is similar to the appearance of portions of the vehicle adjacent the entry handle. Therefor, the finish enables the keys, grip cover, or entry handle to effectively "blend in" with adjacent portions of the vehicle to create a desired aesthetic appearance when the illumination source is not illuminated.

In addition to providing desired optical properties, the finish can be "texturized" to create desired visual and tactile effects. For example, a textured finish can create a desired light output, such as by filtering or diffusing light from the illumination source. Furthermore, the textured finish can have a texture different than the texture of the adjacent areas of the vehicle so that an observer can identify and more readily differentiate the entry handle from the rest of the vehicle.

The finish can be made of any material(s) and can have any form suitable to impart the optical properties described above. The desired optical properties of the finish can be achieved by properties inherent to the finish due to its chemical composition, or by selecting a particular thickness for the finish.

The finish can be a coating applied to the surface associated with the concealed indicia. Exemplary coating materials include, but are not limited to, paints, including metallic paints, such as Ghost Chrome® paint available from Alsa Corporation. Other suitable paints include automotive and non-automotive grade paints, which can be applied with a spraying process. The paint can be applied in accordance with the particular thickness required to achieve the desired optical properties for the finish and to avoid excessive deposition of the paint. Optionally, tint can be added to the paint to achieve a desired color, such as to match the entry handle to the vehicle, and the paint can be coated with a protective clear coat, which can also be tinted to achieve a desired color. The coating can also be in the form of a metal, such as aluminum or chromium, deposited onto the entry handle utilizing any suitable metal deposition process.

Alternatively, the finish can comprise a separate component made of or coated with a material having the properties described above. For example, the finish can be a thin film made of a suitable material, such as a polymeric material or a fabric material, laid on the selected surface to provide a desired cosmetic appearance and to impart the desired optical properties for the entry handle. The film can be a solid color, or can include a pattern or image.

Another exemplary process for applying a film to the selected surface is a hydro-graphic process where a film having a desired appearance, such as a simulated carbon fiber appearance, is floated on liquid, and the entry handle component having the selected surface is dipped into the liquid such that the film attaches to the surface when the component is removed from the liquid. Alternatively, the film can be insert molded with the selected surface. In this process, the film can be inserted into a mold cavity, and the mold closed for injection of material to form the component, e.g. the keys, the grip cover, having the surface. The film and the surface become a single component, with the film functioning as a cosmetic outer skin of the surface.

According to another embodiment of the invention, the finish can be integrated with the selected surface. For example, the component having the surface can be molded of a polymer having a desired color, and the wall thickness of the portion associated with the surface can be selected to achieve the optical properties required of the finish.

While the invention has been specifically described in connection with certain specific embodiments thereof, it is to be understood that this is by way of illustration and not of limitation, and the scope of the appended claims should be construed as broadly as the prior art will permit.

What is claimed is:

1. A keyless entry system for a door having a latch operable between a locked condition, wherein a door is prevented from opening, and an unlocked condition, wherein a door can be opened, the keyless entry system comprising:
   a handle housing pivotally mountable to a door;
   a grip cover for complementary engagement with the handle housing to cooperatively define a door handle grip;
   a keyless entry pad associated with the grip cover, defining a plurality of keys, each one of the plurality of keys identified with a corresponding symbol to collectively form a textual representation of at least one of a vehicle and a user of a vehicle, the plurality of keys being immovable relative to the grip cover;
   a plurality of sensors, each sensor in proximity to at least one of the plurality of keys and corresponding symbol, for detecting an object in the vicinity of at least one of the plurality of keys;
   an illumination source adapted for selective illumination to selectively backlight the plurality of sensors and corresponding symbols; and
   a light-controlling membrane extending over at least a portion of the keyless entry pad comprising a portion of the first surface;
   wherein entering a keyless entry code into the keyless entry pad by selecting keys in a predetermined sequence enables a latch to be selectively disposed in either a locked condition or an unlocked condition; and
   wherein in ambient light, the light-controlling membrane renders the at least one symbol invisible, and when the illumination source backlights the at least one sensor and the at least one symbol, the light-controlling membrane renders the at least one symbol visible.

2. The keyless entry system according to claim 1 wherein the keyless entry pad is formed on a door handle mounted to a door.

3. The keyless entry system according to claim 2 wherein a door handle comprises a grip, and the keyless entry pad is formed on the grip.

4. The keyless entry system according to claim 3 wherein the illumination source is mounted behind the keyless entry pad for backlighting the keys.

5. The keyless entry system according to claim 4 wherein the illumination source comprises a plurality of light sources in register with the keys for individually backlighting each key.

6. The keyless entry system according to claim 4 wherein the illumination source backlights the keys in response to at least one of the following: a user touching at least one of the keys, a user touching the door handle grip, a user actuating a turn signal, a user activating a fob associated with a vehicle, a fob associated with a vehicle being located within a predetermined distance of a vehicle, and a user opening a door from inside a vehicle.

7. The keyless entry system according to claim 4 wherein the illumination source comprises light emitting diodes.

8. The keyless entry system according to claim 1 wherein the illumination source comprises light emitting diodes.

9. The keyless entry system according to claim 1 wherein the sensors comprise field effect sensors.

10. The keyless entry system according to claim 1 wherein the at least one symbol comprises at least one of a make and a model of a vehicle.

11. The keyless entry system according to claim 1 wherein the at least one symbol comprises only letters.

12. The keyless entry system according to claim 1 wherein the at least one symbol comprises a combination of letters and numbers.

13. The keyless entry system according to claim 1 wherein the at least one symbol comprises a logo associated with a vehicle.

14. The keyless entry system according to claim 1 wherein the at least one symbol comprises a name of a user.

15. The keyless entry system according to claim 1 wherein the at least one symbol comprises a name of a favorite sports team of a user.

16. The vehicle door handle according to claim 1 wherein the illumination source is mounted behind the plurality of sensors.

17. A vehicle door handle mounted to a door and coupled with a latch operable between a latched condition, wherein the door is prevented from opening, and an unlatched condition, wherein the door can be opened, the vehicle door handle comprising:
   a grip movably mounted to the door and coupled with the latch for operating the latch between the latched and unlatched conditions, the grip having a first surface facing generally outwardly away from the door, and a second surface facing generally inwardly toward the door;
   a keyless entry pad associated with the grip, comprising a portion of the first surface and defining a plurality of keys, each one of the plurality of keys identified with a corresponding symbol to collectively form a textual representation of at least one of the vehicle and a user of the vehicle, the plurality of keys being immovable relative to the grip cover;
   a plurality of sensors, each sensor in proximity to at least one of the plurality of keys and corresponding symbol, for detecting an object in the vicinity of at least one of the plurality of keys;
   an illumination source adapted for selective illumination to selectively backlight the plurality of sensors and corresponding symbols; and
   a light-controlling membrane extending over at least a portion of the keyless entry pad comprising a portion of the first surface;
   wherein entering a keyless entry code into the keyless entry pad by selecting keys in a predetermined sequence enables the latch to be selectively disposed in either a locked condition or an unlocked condition; and
   wherein in ambient light, the light-controlling membrane renders the at least one symbol invisible, and when the illumination source backlights the at least one sensor and the at least one symbol, the light-controlling membrane renders the at least one symbol visible.

18. The vehicle door handle according to claim 17 wherein activating the keys in a predetermined sequence comprises selecting the at least one symbol in a predetermined sequence.

19. The vehicle door handle according to claim 17, and further comprising an illumination source holder mountable to the handle housing in adjacent disposition to the sensor keypad, and an illumination source assembly supported by the illumination source holder for backlighting the keypad.

20. The vehicle door handle according to claim 17 wherein the keyless entry pad and the plurality of sensors comprise separate and distinct assemblies.

* * * * *